United States Patent [19]

Aketagawa et al.

[11] Patent Number: 4,987,857
[45] Date of Patent: Jan. 29, 1991

[54] VACUUM DEPOSITION APPARATUS WITH DUST COLLECTOR ELECTRODE

[75] Inventors: Kenichi Aketagawa; Junro Sakai, both of Fuchu, Japan

[73] Assignee: Anelva Corporation, Tokyo, Japan

[21] Appl. No.: 348,538

[22] Filed: May 8, 1989

[30] Foreign Application Priority Data

Jun. 21, 1988 [JP] Japan .............................. 63-152859
Nov. 10, 1988 [JP] Japan .............................. 63-284457

[51] Int. Cl.⁵ ............................................ C23C 16/50
[52] U.S. Cl. .................................. 118/723; 118/726; 156/610; 427/35; 427/38
[58] Field of Search .............. 118/723, 726; 156/610; 204/192.31, 298; 427/35, 42, 38, 50

[56] References Cited

U.S. PATENT DOCUMENTS

| | | | |
|---|---|---|---|
| 3,583,361 | 6/1971 | Laudel, Jr. | 204/298 PI |
| 4,217,855 | 8/1980 | Takagi | 204/298 PI |
| 4,559,901 | 12/1985 | Morimoto et al. | 118/723 |
| 4,687,939 | 8/1987 | Miyauchi | 250/492.2 |
| 4,805,555 | 2/1989 | Itoh | 118/723 |

FOREIGN PATENT DOCUMENTS

| | | | |
|---|---|---|---|
| 161205 | 3/1985 | European Pat. Off. | |
| 57-171666 | 10/1982 | Japan | |
| 57-57553 | 12/1982 | Japan | |
| 61-24214 | 2/1986 | Japan | 204/192.31 |
| 61-119669 | 6/1986 | Japan | |
| 62-112790 | 5/1987 | Japan | |
| 64-11347 | 2/1989 | Japan | |
| WO/02597 | 5/1987 | PCT Int'l Appl. | |

OTHER PUBLICATIONS

Houghton et al., "A Preliminary Study of Impurities and Defects In Si-MBE Layers", 326, Journal of Crystal Growth, 81 (1987).
IBM Technical Disclosure Bulletin, "Reducing Dust-Induced Pinholes in Sputtered Films," by E. Stern, vol. 12, No. 1, Jun. 1969.
Morton Panish et al., "Molecular Beam Epitaxy," 8045, IEEE Spectrum, vol. 17 (1980), Apr., No. 4.

Primary Examiner—Norman Morgenstern
Assistant Examiner—Terry J. Owens
Attorney, Agent, or Firm—Pollock, VandeSande & Priddy

[57] ABSTRACT

A vacuum deposition apparatus has a vacuum evaporation chamber provided therein with a dust collector electrode(s) and optionally with an electron beam source. When a DC voltage is applied to the dust collector electrode(s), large polarized dust particles and molecular clusters present in a space in the chamber are attracted to the dust collector electrode(s) by virtue of an electric force given thereto by application of the voltage thereto to enable a deposited film to be formed with a decrease in the number of surface defects thereof. The electron beam source, if present, serves to electrify or ionize only dust particles and molecular clusters having a large scattering cross section. A DC voltage reverse in polarity to that of the dust collector electrode(s) may be applied between a secondary molecular beam source and a substrate, a dopant substance being provided in the secondary molecular beam source to increase the amount of doping of growing crystals.

5 Claims, 8 Drawing Sheets

FIG_1

FIG_5
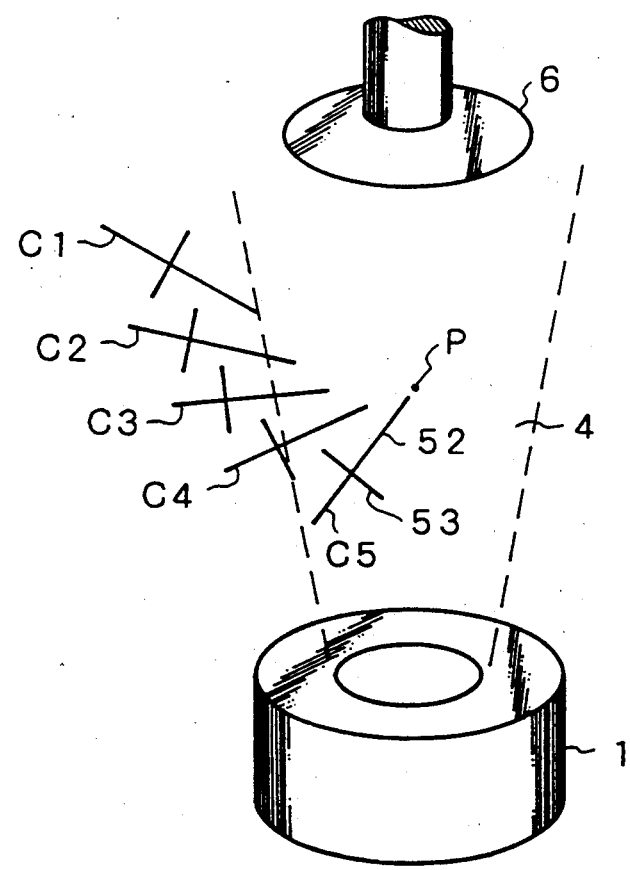

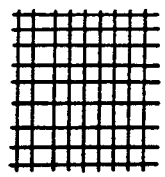
FIG_6(d)
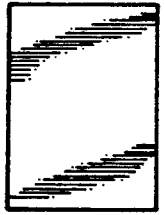
FIG_6(c)
FIG_6(b)
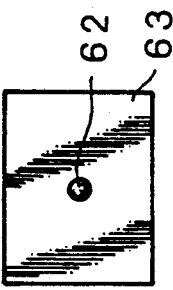
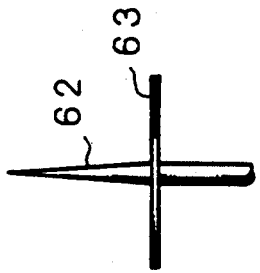
FIG_6(a)

FIG_6(e)
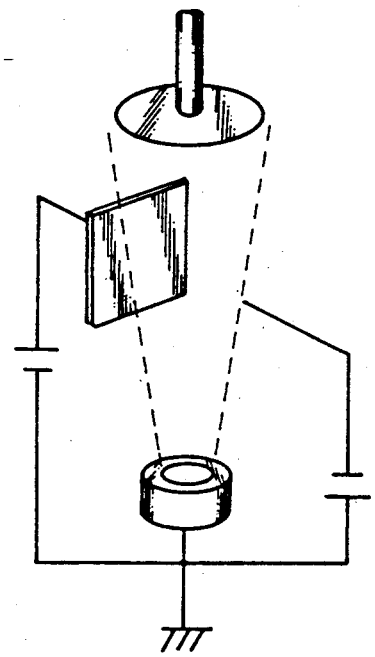
FIG_6(f)
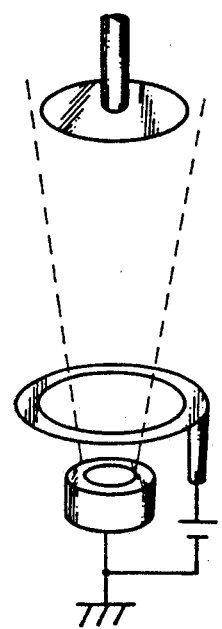
FIG_6(g)
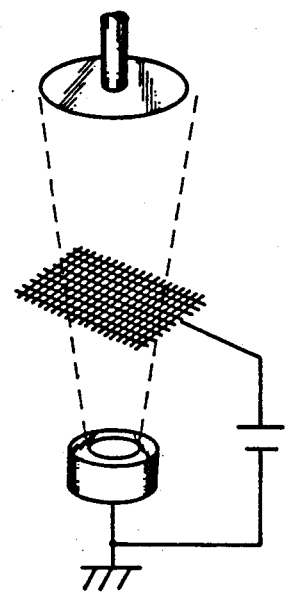
FIG_6(h)
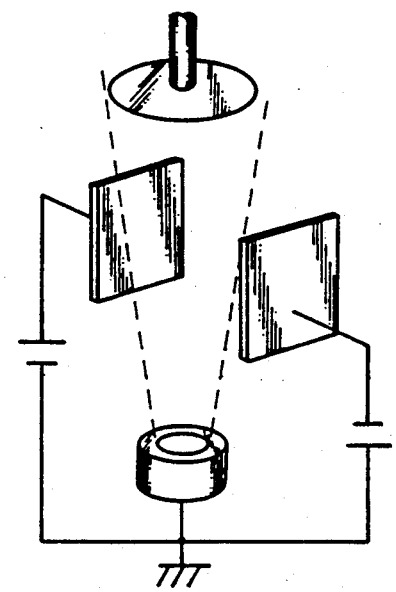

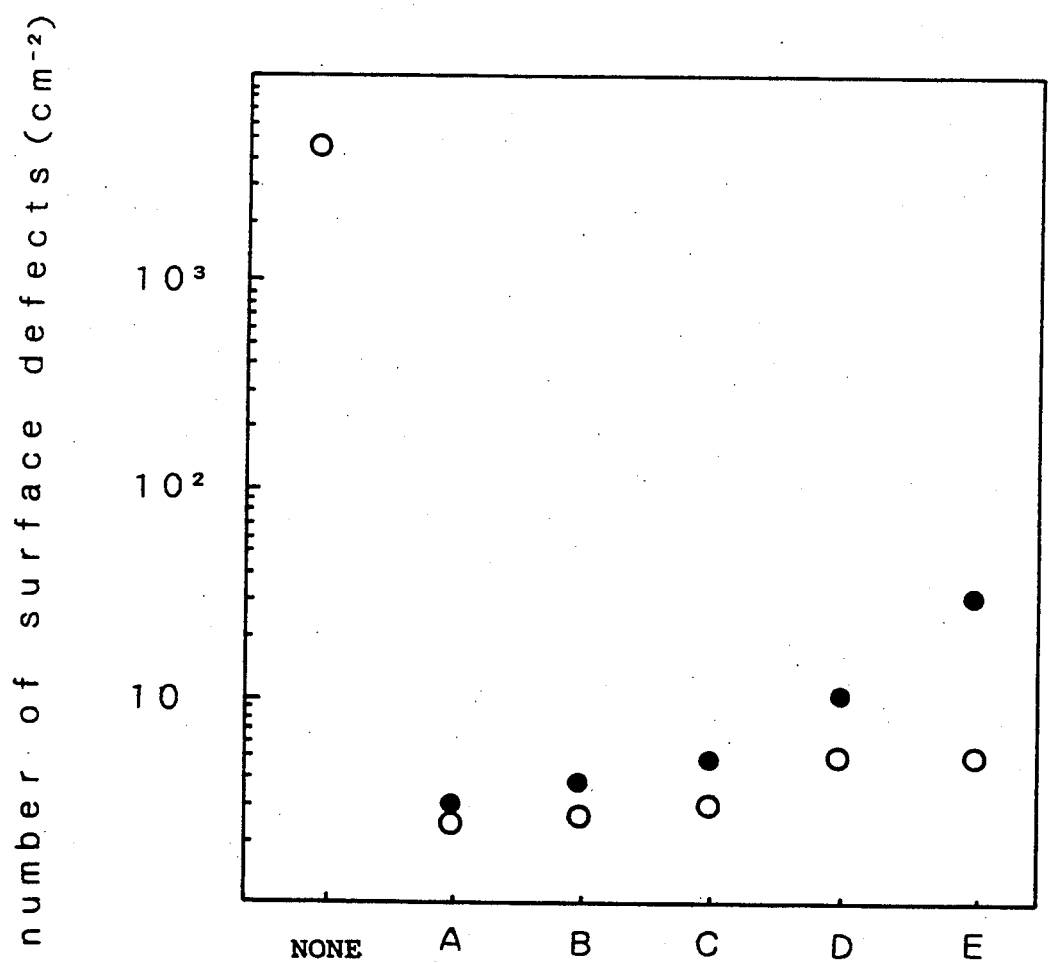
FIG_7

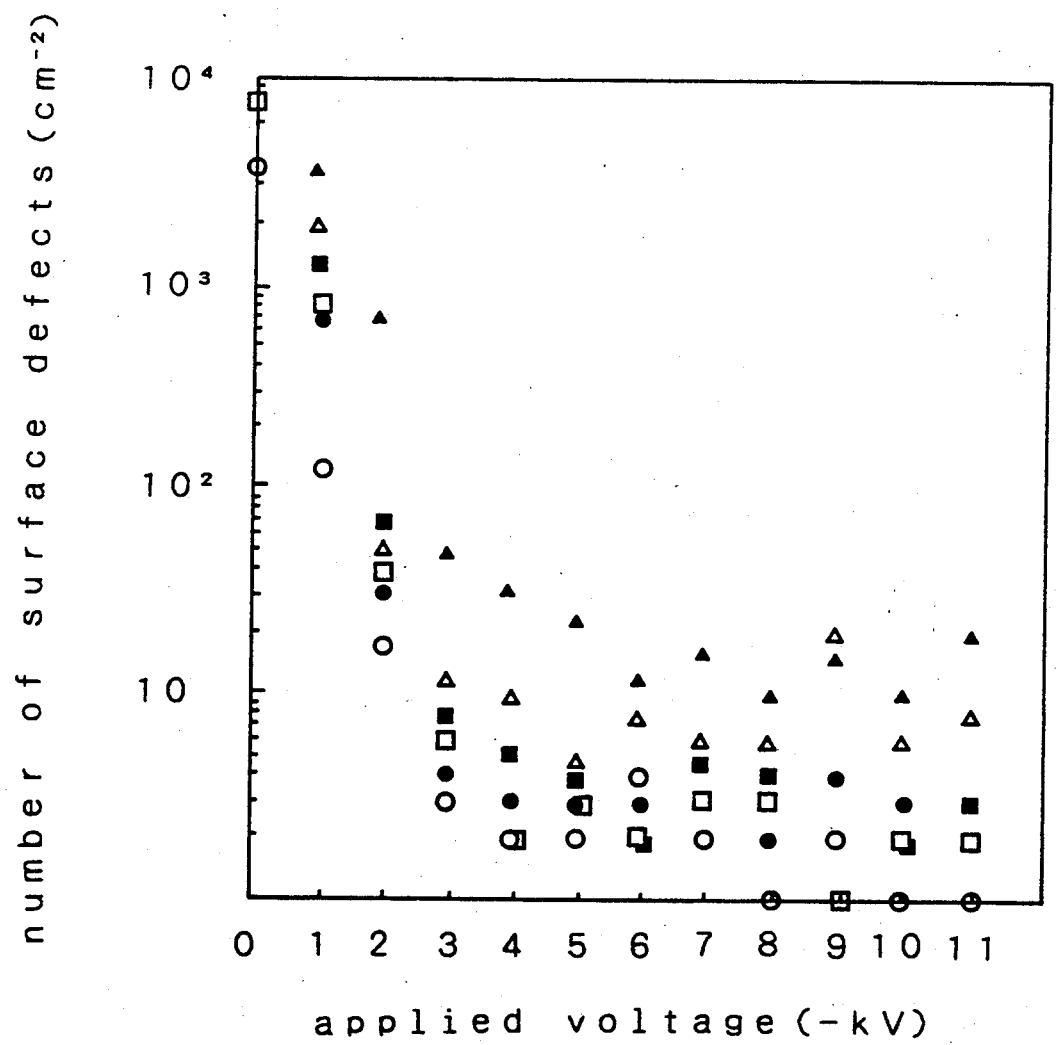
FIG_8

VACUUM DEPOSITION APPARATUS WITH DUST COLLECTOR ELECTRODE

BACKGROUND OF THE INVENTION

1. Field of the Invention

The present invention relates to a vacuum deposition apparatus which can form a deposited film having a decreased number of surface defects attributed to dust particles, molecular clusters, and the like. While the concept of the present invention is applicable to all types of vacuum deposition apparatuses, description will be made of a molecular beam epitaxial growth apparatus as a representative one of those vacuum deposition apparatuses.

In order to effect molecular beam epitaxial growth (representative of vacuum deposition) with as small a number of surface defects as possible, the purity of a material for crystal growth to be used in a molecular beam source (representative of various primary evaporation sources) is raised, and/or an oil free pumping system capable of raising the degree of cleanness inside a molecular beam epitaxial growth chamber is used to create a super high vacuum wherein molecular beam epitaxial growth is effected.

In a molecular beam epitaxial growth apparatus wherein the above-mentioned conventional techniques are utilized, however, dust particles, molecular clusters (large bunches of molecules, which may often be formed and fly as such without being divided into individual molecules when a molecular beam is formed by vacuum evaporation), and the like in a space in a molecular beam epitaxial growth chamber cannot be removed therefrom, even though impurities in a gas itself remaining in the chamber space and in a material for crystal growth can be removed.

In general, dust particles and the like are not easy to remove from an apparatus wherein a super high vacuum is maintained. Therefore molecular beam epitaxial growth, using such an apparatus, involves a defect of being accompanied by development of a considerably large number of surface defects attributed to dust particles and molecular clusters. Particularly where a molecular beam source as a primary evaporation source (evaporation source to be used for film formation) is combined with another molecular beam source as a secondary evaporation source (evaporation source to be used for doping) between which and a substrate a DC voltage is applied to increase the efficiency of doping with an impurity or dopant contributory to electric conduction through a crystalline (single crystal or polycrystalline) film to be formed, the number of surface defects in the film tends to notably increase. Thus, a measure against such a tendency has been in serious demand.

SUMMARY OF THE INVENTION

An object of the present invention is to find a solution for the above-mentioned problems and provide therethrough a vacuum deposition apparatus capable of forming a high-quality deposited film while strongly suppressing the influences of dust particles and molecular clusters, and particularly a molecular beam epitaxial growth apparatus which permits a DC voltage to be applied between a substrate and a secondary molecular beam source (as well as other parts with the same electric potential as that of the secondary molecular beam source, including the wall of a molecular beam epitaxial growth chamber) without incurrence of any substantial increase in the number of surface defects in a film being deposited.

In accordance with the present invention, the above-mentioned object can be achieved by providing a vacuum deposition apparatus comprising a vacuum deposition chamber provided therein with at least one dust collector electrode between which and an evaporation source a high DC voltage is applied to give the above-mentioned at least one dust collector electrode an electric force by which dust particles and molecular clusters are removed from a space in the vacuum deposition chamber.

Further, the above-mentioned object can be more effectively achieved by providing a vacuum deposition apparatus comprising a vacuum deposition chamber provided therein with at least one dust collector electrode between which and an evaporation source a high DC voltage is applied to give the above-mentioned at least one dust collector electrode an electric force by which dust particles and molecular clusters are removed from a space in the vacuum deposition chamber, and further with an electron beam source which is used to irradiate a space in the proximity of the dust collector electrode with an electron beam emitted therefrom.

A dust collector electrode located in such a position as not to prevent a vapor emitted from an evaporation source from flying toward a substrate not only permits the uniformity of vacuum deposition on the substrate to be secured, but also can achieve very little defective vacuum deposition by application thereto of a high DC voltage during vacuum deposition.

Where there is no electrode beam irradiation from an electron beam source, dust particles and molecular clusters in a space in a molecular beam epitaxial growth chamber are polarized by a strong electric field created with the dust collector electrode. Where the electric field has a gradient, only the dust particles and the molecular clusters which are larger than molecules are charged by a difference in the electric field created therearound and become receptive to the force created by the gradient of electric field intensity (gradient force of electric field). As a result, the dust particles and molecular clusters are removed from within a molecular beam advancing toward a substrate. This is believed to decrease the number of surface defects of a film vacuum-deposited on the substrate.

On the other hand, where electron beam irradiation is done from an electron beam source, only dust particles and molecular clusters with a large scattering cross section in a space in a molecular beam crystal growth chamber are charged or ionized upon irradiation thereof with an electron beam. Only harmful charged or ionized dust particles and molecular clusters with a certain or large size are removed from within a molecular beam advancing toward a substrate. This is believed to decrease the number of surface defects of a film vacuum-deposited on the substrate.

BRIEF DESCRIPTION OF THE DRAWINGS

The foregoing and other objects and advantages of the present invention will be seen by reference to the description, taken in connection with the accompanying drawings, in which:

FIGS. 4 and 5 are illustrations showing the positions of a dust collector electrode adopted in the course of examination to find the relationship between the position of the dust collector electrode and the number of surface defects;

FIGS. 6(a) to 6(h) are diagrams showing various shapes of dust collector electrodes prepared for use, respectively;

FIG. 7 is a diagram showing the relationship between the position of a dust collector electrode and the number of surface defects; and FIG. 8 is a diagram showing the relationship between the voltage applied to a dust collector electrode and the number of surface defects.

DETAILED DESCRIPTION OF PREFERRED EMBODIMENTS

Figure 1:
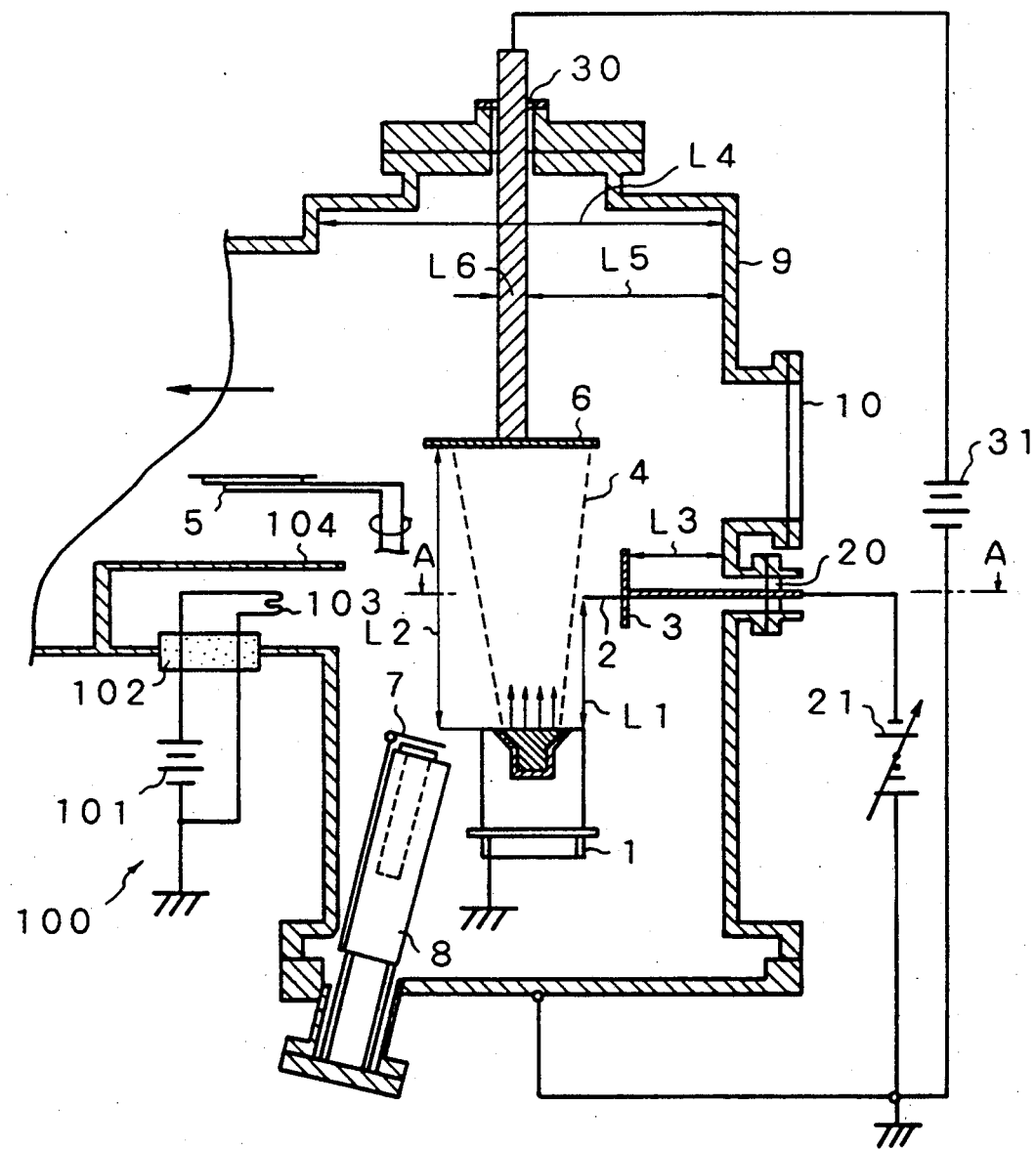
FIG. 1 is a front cross-sectional view of an example of the molecular beam epitaxial growth apparatus of the present invention, comprising a dust collector electrode, a molecular beam source, and a substrate.
Figure 2:
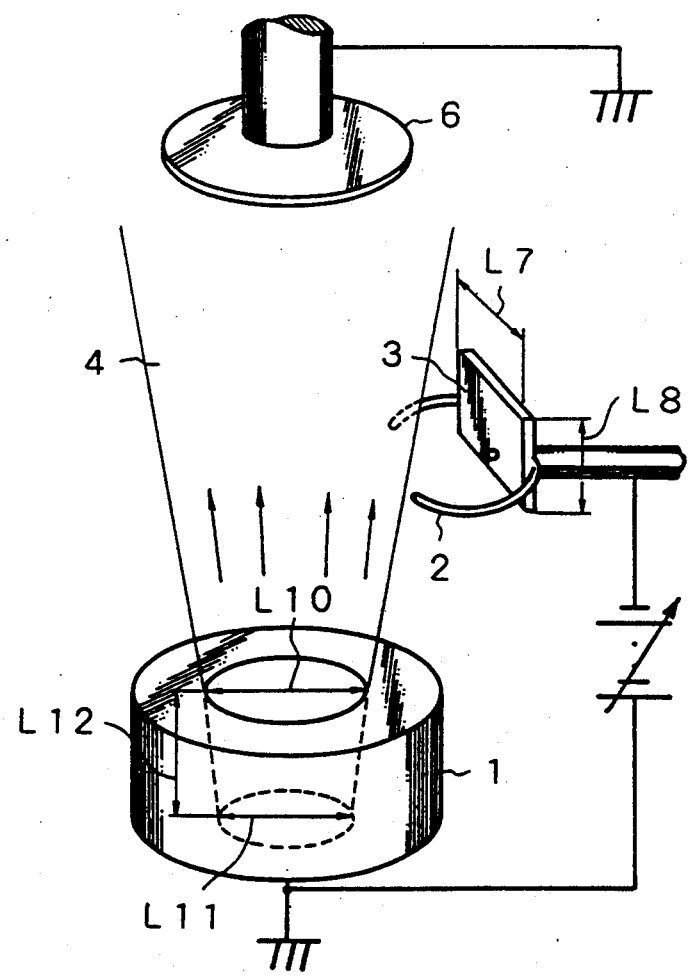
FIG. 2 is a perspective view of the principal mechanism of the apparatus as shown in FIG. 1.

FIG. 1 is a schematic front cross-sectional view of an example of the molecular beam epitaxial growth apparatus of the present invention and FIG. 2 is an enlarged perspective view of the principal mechanism thereof.

Figure 3:
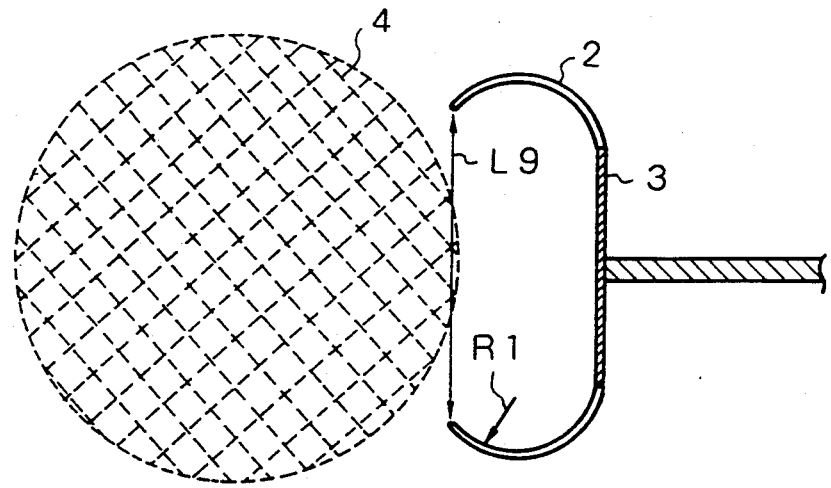
FIG. 3 is a partial cross-sectional view taken along line A—A of FIG. 1.

FIG. 3 is a partial view taken along the line A—A of FIG. 1. When the dust collector electrode with the electrode parts 2 and 3 as shown in either FIG. 1 or FIG. 3 is seen askance from above, it appears as shown in FIG. 2. In other words, when the dust collector electrode with the electrode parts 2 and 3 as shown in FIG. 2 is seen just right in the lateral direction, it appears as shown in FIG. 1, while it appears as shown in FIG. 3 when it is seen just right from above.

A molecular beam epitaxial growth chamber 9 (hereinafter referred to simply as "chamber") has a wall provided in one portion thereof with a peep window 10.

A molecular beam 4 emitted from a molecular beam source 1 heated with an electrode gun not shown in the figures is shut out with a shutter 5 or allowed upon opening of the shutter 5 to fly through a flight path toward a substrate 6 (in the figures, the shutter 5 is opened). The chamber 9 and the molecular beam source 1 are both grounded.

A positive or negative DC voltage V31 can be applied from a DC source 31 located outside the chamber 9 to the substrate 6 electrically insulated from the chamber 9 with an insulator 30.

A dust collector electrode, which is newly provided according to the present invention, comprises two needle-like electrode parts 2 and a plate electrode part 3 electrically connected with each other, and is electrically insulated from the chamber 9 with an insulator 20. A high positive or negative DC voltage V21 can be applied from a high-voltage DC power source 21 located outside the chamber 9 to the dust collector electrode.

Molecular beam source 8 which generates a molecular beam by a resistance heating system is provided as an adjutant one (secondary molecular beam source) in the case where the molecular beam source 1 is used as the primary one. In some cases, however, the molecular beam source 8 may be inversely used as the primary molecular beam source. A shutter 7 may be used to shut out a molecular beam emitted from the secondary molecular beam source 8. The secondary molecular beam source 8 is the same in electric potential as the wall of the chamber.

An electron beam irradiation unit 100 comprises a filament 103 to serve as an electron beam source. An electric current is sent from a grounded low-voltage DC power source 101 on the side of the atmosphere through a wiring running through an insulator 102 provided in part of the chamber wall to the filament 103 to heat therewith the filament 103 up to an incandescent state, in which an electron beam is emitted from the filament 103. A space in the proximity of the aforementioned dust collector with the electrode parts 2 and 3 is irradiated with the electron beam.

The following description of the present invention will be divided into the case where the electron beam irradiation unit 100 is used and the case where the electron beam irradiation unit 100 is not used.

The operation of the above-mentioned example of the present invention will be described by taking as a representative instance a case where an epitaxially grown silicon film is deposited on a Si substrate 6.

In this case, Si for epitaxial growth is filled or placed in the molecular beam source 1. Where antimony is to be doped into a surface portion of epitaxially grown silicon film, antimony is filled in the secondary molecular beam source 8.

As described hereinbefore, a DC voltage may often be applied between the secondary molecular beam source 8 (and the wall of the chamber) and the substrate 6 in order to increase the amount of doping.

Meanwhile, particularly in order to effect the crystal growth of ZnS, a resistance heating system must be used in a molecular beam source. An experiment was also made, wherein ZnS (zinc sulfide) as a material for crystal growth was to be placed in the molecular beam source 8 with the resistance heating system, which was used as a primary molecular beam source in this experiment.

The authors of the present invention used the molecular beam epitaxial growth apparatus having the above-mentioned structure to carry out an experiment first without using the electron beam irradiation unit 100.

As a result, they found that molecular beam epitaxial growth on the surface of a substrate 6 can be effected with no substantial surface defects when the value of voltage applied to the dust collector electrode with the electrode parts 2 and 3 is optimized together with the positions of the electrode parts 2 and 3 in relation to the molecular beam 4.

The dimensions of L1 to L12 and R1 (shown in FIGS. 1 to 3) in the apparatus used in the experiment leading to the above-mentioned finding are as follows.

L1=125, L2=250, L3=80, L4=400$\phi$, L5=190, L6=15$\phi$, L7=80, L8=80, L9=90, L10=40$\phi$, L11=35$\phi$, L12=20, R1=30. (unit:mm)

The Si molecular beam source 1 was heated with a 10 kW electron gun at an acceleration voltage of 10 kV to effect Si molecular beam epitaxial growth on the surface of a Si substrate 6 of 4 inches $\phi$, while a voltage V31 of zero and a voltage V21 of zero were kept for the Si substrate 6 and the dust collector electrode with the electrode parts 2 and 3, respectively (that is, the grounding voltage was kept for both). The number of surface defects in the resulting epitaxial-grown film was 33/cm$^2$.

Molecular beam epitaxial growth was effected under substantially the same conditions as described above except that the voltage V21 applied to the dust collector electrode with the electrode parts 2 and 3 made of Ta was changed to −5 kV. The number of surface defects in the resulting epitaxial-grown film was 0/cm². In other words, that film had a perfectly defect-free surface. The rate of crystal growth was the same as in the preceding case.

Such a good result can never be obtained using any conventional molecular beam epitaxial growth apparatuses.

Additionally stated, the high voltage V21 of −5 kV exerted no influence on an electric field created by the electron gun for the molecular beam source 1.

Two reasons are conceivable for the above-mentioned good result. One reason is that an electric field created by the electrode parts 2 and 3 of the dust collector electrode polarized dust particles, molecular clusters and the like in a space in the chamber, among which those with a certain or larger size were collected onto the electrode parts 2 and 3 of the dust collector electrode by the so-called gradient force of the electric field. The other reason is that only those particles electrified or ionized with the electron gun deviated from the main stream of the molecular beam (repelled by virtue of the polarity of the particles) and moved toward the electrode parts 2 and 3 of the dust collector electrode not to reach the substrate, thus enabling crystal growth to be effected without lowering the rate thereof and with no surface defects in the resulting epitaxial-grown film.

The idea that the strong electric field should have acted on dust particles and molecular clusters to favorably affect the number of surface defects was found to be reasonable through the following experiments.

Figure 4:
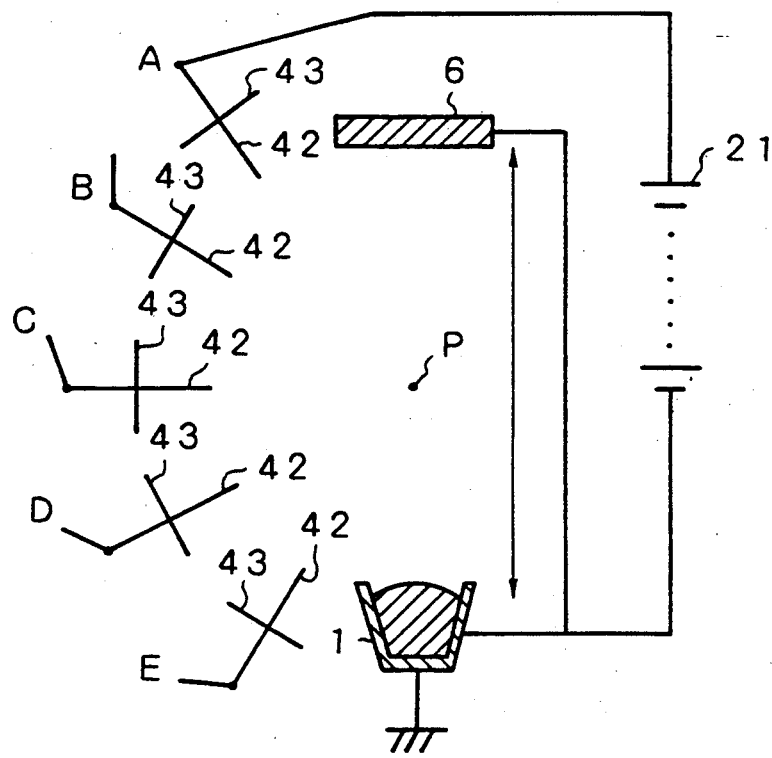

First, the dust collector electrode was replaced with one having electrode parts 62 and 63 as shown in FIG. 6(a), which was fixed in a position C as shown in FIG. 4. The relationship between the applied voltages V21 and V31 and the number of surface defects was examined. The results are shown in FIG. 8. In this experiment, the output of the electron gun was controlled so as to provide a crystal growth rate of 2 Å/sec.

The marks of ● refer to cases where a voltage negative relative to the potential of the molecular beam source was applied to the dust collector electrode.

The marks of ○ refer to cases where a voltage positive relative to the potential of the molecular beam source was applied to the dust collector electrode.

The marks of ▲ refer to cases where a voltage negative relative to the potential of the molecular beam source was applied to the dust collector electrode while a voltage of +600 V was applied to a substrate.

The marks of △ refer to cases where a voltage positive relative to the potential of the molecular beam source was applied to the dust collector electrode while a voltage of +600 V was applied to a substrate.

The marks of ■ refer to cases where a voltage negative relative to the potential of the molecular beam source was applied to the dust collector electrode while a voltage of −600 V was applied to a substrate.

The marks of □ refer to cases where a voltage positive relative to the potential of the molecular beam source was applied to the dust collector electrode while a voltage of −600 V was applied to a substrate.

With a voltage of mere 3 to 4 kV applied to the dust collector electrode with the electrode parts 62 and 63, the number of surface defects was decreased to less than 1/1,000 of that in the case of no voltage application to the dust collector electrode, thus proving that a sufficient effect can be achieved according to the present invention.

Additionally stated, with application of voltage of up to 8 kV, an electric current of about 2 mA flowed between the dust collector electrode and the evaporation source (namely earth or ground), though it varied slightly in proportion to the output of the electron gun.

Upon application of a voltage exceeding 8 kV, discharge occurred in some cases, where a higher voltage, therefore, could not be applied to a dust collector electrode.

Experiments were carried out, wherein the position of the dust collector electrode was varied in the same chamber.

As shown in FIG. 4, the tip of the needle-like electrode part 42 was pointed at the middle point P of the line connecting the substrate with the molecular beam source with a distance of 125 mm between the middle point P and the tip of the needle-like electrode part 42 to which a high voltage was applied. While keeping the above-mentioned conditions, the dust collector electrode with the electrode parts 42 and 43 was located in turn in the positions A, B, C, D, and E with the height of the position C being 125 mm from a crucible of the molecular beam source and with an angular interval of about 30° between mutually nearest positions (the position A alone being located slightly backward to avoid collision of the dust collector electrode against the substrate) to carry out an experiment, which provided experimental data as plotted in FIG. 7 to show the relationship between the number of surface defects and the position of the dust collector electrode the marks of    and    having the same definitions given earlier in the discussion of FIG. 8. A voltage of +3 kV or −3 kV was applied to the dust collector electrode with the electrode parts 42 and 43 to examine the performance thereof.

When no dust collector electrode was used (designated by the word "none" in FIG. 7), the number of surface defects was about 3,800/cm², whereas the use of the dust collector electrode in every one of those positions proved effective. The results obtained were comparatively better as the dust collector electrode was located nearer to the position of substrate 6.

Application of either positive or negative bias voltage to the dust collector electrode provided the effect of reducing the number of surface defects.

Similarly, as shown in FIG. 5, the distance of the tip of the needle-like electrode part 52 of the dust collector electrode from the middle point P of the flight route of molecular beam was varied with the height of the dust collector electrode being kept at 125 mm from the molecular beam source to carry out an experiment, which provided results shown in Table 1.

TABLE 1

| Distance from P | Number of Surface Defects(/cm²) +3 kV | −3 kV | Uniformity of Film Thickness |
|---|---|---|---|
| C1 150 | 12 | 30 | ± 2% ≧ |
| C2 125 | 3 | 5 | ± 2% ≧ |
| C3 75 | 3 | 3 | ± 2% ≧ |
| C4 25 | 2 | 3 | ± 5% ≧ |
| C5 0 | 3 | 2 | ± 5% ≧ |

Although no clear-cut differences appeared between the runs according to the present invention, the tendency was such that the number of surface defects was larger as the dust collector electrode was more apart from the molecular beam. This is surely suggestive of collection by the dust collector electrode of dust particles and molecular clusters inside the molecular beam. Additionally stated, when the dust collector electrode was located in the molecular beam, the uniformity of the thickness of a film formed was worse than those attained when the dust collector electrode was located outside the molecular beam.

Table 2 shows results obtained using the electron gun in comparison with results obtained using the resistance heating system. In this experiment, ZnS (zinc sulfide) was used as a material for crystal growth to be placed in the molecular beam sources. The electron gun was used in combination with the molecular beam source 1 as shown in FIG. 1 as a primary molecular beam source, while the resistance heating system was used in combination with the molecular beam source 8 as shown in FIG. 1 as a primary molecular beam source. In the case of the electron gun as well as in the case of the resistance heating system, the dust collector electrode was located in the position C as shown in FIG. 4.

TABLE 2

| Conditions | Number of Surface Defects(/cm$^2$) | |
|---|---|---|
| | Electron Gun | Resistance Heating |
| Dust Collector Electrode 0V | 2800 | 500 |
| Dust Collector Electrode 0V, Substrate +600V | 4200 | 1800 |
| Dust Collector Electrode 0V, Substrate −600V | 3600 | 1600 |
| Dust Collector Electrode +3kV | 8 | 20 |
| Dust Collector Electrode −3kV | 10 | 15 |
| Dust Collector Electrode +3kV, Substrate +600V | 15 | 10 |
| Dust Collector Electrode −3kV, Substrate +600V | 12 | 20 |
| Dust Collector Electrode +3kV, Substrate −600V | 19 | 10 |
| Dust Collector Electrode −3kV, Substrate −600V | 8 | 9 |

It can be understood that the effect of the dust collector electrode is very great no matter which of the different mechanisms the formation of a molecular beam may be based on. The reason for development of particularly many surface defects in the cases of using the electron gun without using the dust collector electrode is believed to be that some dust particles attracted to the material by an electric field created with the electron gun might cause formation of molecular clusters and some other dust particles might fly as such together with the molecular beam.

The dependency of the number of surface defects on the shape of dust collector electrode(s) was examined in the case of using an electron gun for a molecular beam source as well as in the case of using a resistance heating system for a molecular beam source.

Use was made of various dust collector electrodes having respective shapes as shown in FIGS. 6(a), 6(b), 6(c), 6(d), 6(e), 6(f), 6(g) and 6(h). Each one of the dust collector electrodes shown in FIGS. 6(a), 6(b), 6(c) and 6(d) was fixed in the position C as shown in FIG. 4, while each one or set of the dust collector electrodes shown in FIGS. 6(e), 6(f), 6(g) and 6(h) was fixed in the respective position(s) as mentioned in Table 3 and shown in Table 6. A voltage of +3 kV was applied thereto. No bias voltage was applied to a substrate. The results of examination of the number of surface defects are shown in Table 3.

TABLE 3

| Shape of Dust Collector Electrode(s) | | Number of Surface Defects (/cm$^2$) | |
|---|---|---|---|
| | | Electron Gun | Resistance Heating |
| no electrode | | 3420 | 680 |
| electrode with rectangular plate and needle-like electrode parts | FIG.6(a) | 5 | 15 |
| disc electrode | FIG.6(b) | 6 | 120 |
| rectangular electrode | FIG.6(c) | 8 | 98 |
| gauze electrode | FIG.6(d) | 8 | 8 |
| rectangular plate electrode and needle-like electrode (Note 1) | FIG.6(e) | 10 | 30 |
| ring electrode (Note 2) | FIG.6(f) | 25 | 372 |
| gauze electrode disposed in molecular beam | FIG.6(g) | 7 | 7 |
| two parallel flat electrodes disposed so as to sandwich molecular beam | FIG.6(h) | 6 | 296 |

Particularly in the case where the gauze electrode shown in FIG. 6(g) was disposed in the molecular beam, the rate of epitaxial growth was low and the uniformity of the film thickness was very bad. Aside from these, a decrease in the number of surface defects was recognized with every shape(s) of dust collector electrode(s). In every case, it was found that the use of the electron gun provided a far superior effect of dust collector electrode to the use of the resistance heating system. In the case of using the resistance heating system for the molecular beam source, it will be understood from the results that adoption of any angular shape for a dust collector electrode might be more effective. The reason for this is believed to be that a steep gradient of electric field intensity created around the sharp portion of a dust collector electrode might work advantageously. The fact that the set of two parallel flat plate electrodes (FIG. 6(h)) to create a uniform electric field exhibited a comparatively little effect may be convincing of the reasonableness of the aforementioned model that dust particles and molecular clusters with a certain or larger size compared to the size of molecules are more strongly receptive to a gradient of electric field.

An experiment was carried out on whether or not a dust collector electrode may exert an influence on the efficiency of dopant doping.

As the conventional methods of doping with a substance having a low sticking coefficient such as Sb, there can be mentioned a method wherein a voltage is applied to a substrate to pull into the substrate Si ions formed by ionization of Si with electrons emitted from an electron gun type evaporation source so that the Si ions can assist Sb absorbed on the surface of the substrate to be injected into the substrate, and a method wherein an ionization mechanism is provided in an upper portion of a resistance heating type molecular beam source for a dopant Sb to decompose part of Sb molecules into Sb ions. Thus, experiments using the above-mentioned two respective methods were carried out.

In the structure of FIG. 1, a dust collector electrode having a shape as shown in FIG. 6(a) was located in the position C as shown in FIG. 4 and a voltage of +3 kV or −3 kV was applied to the dust collector electrode. The molecular beam source 1 was heated with the electron gun. A dopant (impurity) was applied from the resistance heating type molecular source 8. The carrier density was determined by utilizing the Hall effect at room temperature. The dopant was antimony (Sb), which is an n-type dopant. The results are shown in Table 4.

TABLE 4

| Dopant | Conditions | | Number of Surface Defects | Carrier Density (cm$^{-3}$) |
|---|---|---|---|---|
| | Dust Collector Electrode | Substrate | | |
| Sb | 0V | 0V | 3100 | $1.0 \times 10^{16}$ |
| | 0V | −400V | 3300 | $1.5 \times 10^{18}$ |
| | +3kV | −400V | 4 | $1.7 \times 10^{16}$ |
| | −3kV | −400V | 10 | $1.5 \times 10^{16}$ |

It will be understood from Table 4 that the amount of doping is decreased when a high voltage is applied to a dust collector electrode. The reason for this is believed to be that some assist ions for doping might be affected by a dust collector electrode to fail to reach a substrate.

In view of the above, a resistance heating type molecular beam source with an ionization mechanism was prepared. The ionization mechanism is attached to the top of the molecular beam source, and comprises a filament and a grid. Electrons emitted from the filament are accelerated by an electric field created between the filament and the grid. Molecules receiving the impact of the accelerated electrons are ionized. The ionization mechanism is hereinafter referred to as an "ionization molecular beam source". The ionization molecular beam source was disposed nearer to a substrate than to a dust collector electrode. The influence of the dust collector electrode on impurity doping was examined. The results are shown in Table 5.

TABLE 5

| Dopant | Conditions | | Number of Surface Defects | Carrier Density (cm$^{-3}$) |
|---|---|---|---|---|
| | Dust Collector Electrode | Substrate | | |
| Sb | 0V | 0V | 3100 | $1.0 \times 10^{16}$ |
| | 0V | −400V | 3300 | $1.5 \times 10^{18}$ |
| | +3kV | −400V | 25 | $1.7 \times 10^{18}$ |
| | −3kV | −400V | 10 | $1.5 \times 10^{16}$ |

It will be understood from Table 5 that impurity doping is not affected at all by a collector electrode while the number of surface defects can still be decreased, if a resistance heating type ionization molecular beam source is disposed near to a substrate and the potentials of a dust collector electrode and a substrate are chosen suitably.

In every one of the foregoing experiments, a dust-collecting effect of the dust collector electrode could be seen even without slowing down the epitaxial growth, though some difference in the effect was recognized therebetween.

As a second effect of provision of a dust collector electrode, it was visually observed that bumping of a vacuum deposition material, which is liable to occur in the case of using an electron gun for a molecular beam source, was subdued quickly upon application of a high voltage to the dust collector electrode. This will make it obvious that bumping of a vacuum deposition material, which quite often occurs in the case of using an electron gun, is caused by dust particles pulled into the material by an acceleration electric field created by an electron gun. The reduction in bumping is suggestive of a drastic decrease in the number of molecular clusters in a molecular beam as well.

An experiment similar to that described hereinbefore was carried out using the electron beam irradiation unit 100, namely heating the filament 103 as the electron beam source up to an incandescent state, with the aim of improving the dust-collecting effect of a dust collector electrode in the case of using a resistance heating type molecular beam source. This was an attempt made with paying attention to the fact that the use of the electron gun for the molecular beam source enhanced the dust-collecting effect even in the case of a uniform electric field created with the set of the two parallel flat plate electrodes.

A cover 104 was provided just above the filament 103 to keep the filament 103 from commanding a view of a substrate 6 for the purpose of avoiding any damage that might otherwise have been inflicted onto the surface of the substrate by intense irradiation thereof with an electron beam from the filament 103. The dependency of the number of surface defects on the shape of dust collector electrode was examined in the case of using the electron beam irradiation unit 100 in combination with the electron gun as well as in the case of using the electron beam irradiation unit 100 in combination with the resistance heating type molecular beam source. Dust collector electrodes each having one of various shapes as shown in FIGS. 6(a)–6(h) were prepared. Each one of the dust collector electrodes shown in FIGS. 6(a), (b), 6(c) and 6(d) was fixed in the position C as shown in FIG. 4, while each one or set of dust collector electrodes shown in FIGS. 6(e), 6(f), 6(g) and 6(h) was fixed in the respective position(s) as mentioned in Table 6. A voltage of +3 kV was applied thereto. No bias voltage was applied to a substrate. The results are shown in Table 6.

TABLE 6

| Shape of Dust Collector Electrode | | Number of Surface Defects (/cm$^2$) | |
|---|---|---|---|
| | | Electron Gun | Resistance Heating |
| no electrode | | 3420 | 680 |
| electrode with rectangular plate and needle-like electrode parts | FIG.6(a) | 8 | 15 |
| disc electrode | FIG.6(b) | 7 | 5 |
| rectangular electrode | FIG.6(c) | 10 | 2 |
| gauze electrode | FIG.6(d) | 10 | 6 |
| rectangular plate electrode and needle-like electrode (Note 1) | FIG.6(e) | 9 | 3 |
| ring electrode (Note 2) | FIG.6(f) | 22 | 27 |
| gauze electrode disposed in molecular beam | FIG.6(g) | 6 | 7 |
| two parallel flat electrodes disposed so as to sandwich molecular beam | FIG.6(h) | 6 | 2 |

In the experiment, good results superior or substantially equal to the respectively corresponding results listed in FIG. 3 were obtained in almost all cases.

Particularly when the resistance heating type molecular beam source was used as the molecular beam source, the use of the electron beam irradiation unit 100 exhibited obviously better effects than the nonuse thereof.

When a high negative voltage was applied to the dust collector electrode, a reduction in the number of surface defects due to the dust collector electrode was seen, though the degree of the reduction was a little smaller than that in the case of application of the positive voltage to the dust collector electrode.

The mechanism of dust collection in the case of electron beam irradiation from the electron beam source 103 as well as in the case of electron beam irradiation from the electron gun may obviously be different from that in the case of no electron beam irradiation. Specifically, in the former two cases, it is believed that electron beam irradiation caused electrification or ionization of only dust particles, molecular clusters and the like having a large scattering cross section in a space in the chamber, among which particularly only those with a certain or large size were then deviated from a flight route which they would have taken if no dust collector electrode were provided, and were thus removed from inside the molecular beam by the dust collector electrode(s) to which a high voltage was applied.

The vacuum deposition apparatus of the present invention is provided with at least one dust collector electrode having a simple structure as described hereinbefore, and optionally with an electron beam irradiation unit. A high voltage is simply applied to at least one dust collector electrode, and optionally a filament in the electron beam irradiation unit, if present, is simply heated, whereby the object of the present invention can be achieved according to a simple and clear-cut mechanism. Thus, the concept of the present invention can be easily utilized not only in molecular beam epitaxial growth apparatuses but also a wide variety of other conventional apparatuses such as vacuum deposition apparatuses for thin film formation to make it possible to form films having a high purity.

Furthermore, dust collector electrodes as mentioned above can be used in vacuum chambers to be used for purposes other than vacuum evaporation and deposition. Since dust and other particles, including considerably large dust particles, in a space in a chamber are collected into one place, apparatuses embodying the present invention are easy to maintain.

Additionally stated, there are conventional apparatuses having a chamber provided with an electrode to which a high voltage is applied. Such apparatuses include one to be used in an "Ion Plating Process" disclosed in Japanese Patent Publication No. 57,553/1982. In all such apparatuses, however, application of a voltage is done to cause discharge through which ionization of molecules is effected. Thus, there are no conventional apparatuses in which application of a voltage is done for purposes of dust collection.

When use is made of the vacuum deposition apparatus of the present invention, the number of surface defects attributed to dust particles and molecular clusters can be very largely decreased without slowing down the crystal growth and without any influences on the efficiency of impurity or dopant doping.

What is claimed is:

1. A vacuum deposition apparatus comprising a vacuum deposition chamber provided therein with at least one dust collector electrode between which and an evaporation source a high DC voltage is applied to give said at least one dust collector electrode an electric force by which dust particles and molecular clusters in a space in said vacuum deposition chamber are removed, and further with an electron beam source which generates an electron beam with which a space in the proximity of said at least one dust collector electrode is irradiated.

2. A molecular beam epitaxial growth apparatus, comprising:
   a vacuum deposition chamber;
   at least one dust collector electrode provided in said vacuum deposition chamber;
   a primary molecular beam source provided in said vacuum deposition chamber to be used as an evaporation source;
   means for applying a DC voltage to said dust collector electrode to effect therefrom an electric force by which dust particles and molecular clusters in a space in said vacuum deposition chamber are removed; and
   a secondary molecular beam source provided in said vacuum deposition chamber, and between which and a substrate a DC voltage reverse in polarity to that applied to said at least one dust collector electrode is applied to increase the amount of doping of growing crystals, a dopant substance being placed in said secondary molecular beam source.

3. A vacuum deposition apparatus, comprising:
   a vacuum deposition chamber;
   at least one dust collector electrode provided in said vacuum deposition chamber;
   a primary molecular beam source provided in said vacuum deposition chamber to be used as an evaporation source;
   means for applying a DC voltage to said dust collector electrode during vacuum evaporation and deposition to effect therefrom an electric force by which dust particles and molecular clusters in a space in said vacuum deposition chamber are removed; and
   a secondary molecular beam source provided in said vacuum deposition chamber, and between which and a substrate a DC voltage reverse in polarity to that applied to said at least one dust collector electrode is applied to increase the amount of doping of growing crystals, a dopant substance being placed in said secondary molecular beam source.

4. A vacuum deposition apparatus, comprising:
   a vacuum deposition chamber;
   at least one dust collector means provided in said chamber;
   an evaporation source means provided in said chamber for emitting a vapor stream toward a substrate;
   wherein said at least one dust collector means comprises a plate electrode and needle-like electrodes, said plate electrode being positioned outside of the path of said vapor stream emitted from said evaporation source means toward said substrate and at least one of said needle-like electrodes being positioned at least partially in the path of said vapor stream; and
   means for applying a voltage between said dust collector means and said evaporation source means.

5. A vacuum deposition apparatus as claimed in claim 4, wherein said evaporation source means comprises an electron gun.

* * * * *

UNITED STATES PATENT AND TRADEMARK OFFICE
CERTIFICATE OF CORRECTION

PATENT NO. : 4,987,857
DATED : January 29, 1991
INVENTOR(S) : Kenichi Aketagawa, et al.

It is certified that error appears in the above-identified patent and that said Letters Patent is hereby corrected as shown below:

Column 6, line 33, before "and" insert --●-- and after "and" insert --0--.

Column 8, after Table 3 and before line 23, insert

--(Note 1) The two electrodes were disposed so as to sandwich a molecular beam while voltages of +1.5 kV and -1.5 kV were applied to the needle-like electrode and the rectangular plate electrode, respectively.

--(Note 2) The dust collector electrode was disposed just above a crucible in such a way to surround a molecular beam with the ring thereof.--

UNITED STATES PATENT AND TRADEMARK OFFICE
CERTIFICATE OF CORRECTION

PATENT NO. : 4,987,857
DATED : January 29, 1991
INVENTOR(S) : Kenichi Aketagawa, et al.

It is certified that error appears in the above-identified patent and that said Letters Patent is hereby corrected as shown below:

Column 10, after Table 6 and before line 55, insert

--(Note 1) The two electrodes were disposed so as to sandwich a molecular beam while voltages of +1.5 kV and -1.5 kV were applied to the needle-like electrode and the rectangular plate electrode, respectively.

--(Note 2) The dust collector electrode was disposed just over a crucible so as to surround a molecular beam with the ring thereof.--

Signed and Sealed this

Twenty-first Day of July, 1992

*Attest:*

DOUGLAS B. COMER

*Attesting Officer*   *Acting Commissioner of Patents and Trademarks*